(12) United States Patent
Hornung et al.

(10) Patent No.: US 7,269,015 B2
(45) Date of Patent: Sep. 11, 2007

(54) HEAT SINK INTERFACE INSERT

(75) Inventors: Craig Warren Hornung, Harrisburg, PA (US); John Thomas Larkin, Jr., Camp Hill, PA (US); Ralph Edward Spayd, Jr., Elizabethtown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 263 days.

(21) Appl. No.: 11/049,545

(22) Filed: Feb. 1, 2005

(65) Prior Publication Data

US 2006/0171123 A1    Aug. 3, 2006

(51) Int. Cl.
*H05K 7/20* (2006.01)

(52) U.S. Cl. .................. 361/704; 257/706; 165/80.3

(58) Field of Classification Search ............... None
See application file for complete search history.

(56) References Cited

U.S. PATENT DOCUMENTS

| | | | |
|---|---|---|---|
| 4,016,021 A * | 4/1977 | La Fleur ................... 156/154 |
| 4,384,610 A * | 5/1983 | Cook et al. ................ 165/80.2 |
| 5,137,283 A | 8/1992 | Giarrusso et al. |
| 5,213,868 A * | 5/1993 | Liberty et al. ............... 428/131 |
| 5,440,172 A * | 8/1995 | Sutrina ...................... 257/712 |
| 5,591,034 A * | 1/1997 | Ameen et al. ............... 439/91 |
| 5,738,936 A | 4/1998 | Hanrahan |
| 6,054,198 A * | 4/2000 | Bunyan et al. ............ 428/40.5 |
| 6,096,414 A | 8/2000 | Young |
| 6,372,997 B1* | 4/2002 | Hill et al. .................... 174/252 |
| 6,411,513 B1* | 6/2002 | Bedard ....................... 361/704 |
| 6,610,635 B2 | 8/2003 | Khatri |
| 6,673,434 B2 | 1/2004 | Nguyen |
| 6,746,768 B2 | 6/2004 | Greinke et al. |
| 6,797,382 B2 | 9/2004 | Nguyen et al. |
| 6,901,997 B2* | 6/2005 | Rauch ........................ 165/185 |
| 7,004,244 B2* | 2/2006 | Rauch ........................ 165/185 |
| 7,063,127 B2* | 6/2006 | Gelorme et al. ........... 165/80.2 |
| 7,132,161 B2* | 11/2006 | Knowles et al. ............ 428/364 |
| 2002/0100581 A1 | 8/2002 | Knowles et al. |
| 2005/0145367 A1* | 7/2005 | Hannah et al. ............ 165/80.3 |
| 2006/0128068 A1* | 6/2006 | Murray et al. ............. 438/120 |

\* cited by examiner

*Primary Examiner*—Boris Chervinsky

(57) ABSTRACT

A heat sink assembly for cooling a heat generating integrated circuit (IC) component is provided. The assembly includes a heat sink base positioned adjacent the IC component and a thermal interface member positioned between the heat sink base and the IC component. The interface member has a first surface in abutting engagement with the heat sink base and an opposite second surface in abutting engagement with an outer surface of a lid on the IC component. The first and second surfaces each include a plurality of protrusions to increase a number of contact points between the interface member and the heat sink base and between the interface member and the outer surface of the lid to facilitate a transfer of heat from the IC component to the heat sink base.

17 Claims, 3 Drawing Sheets

HEAT SINK INTERFACE INSERT

BACKGROUND OF THE INVENTION

The invention relates generally to heat sinks for electronic devices, and more specifically, to a foil gap filler to reduce thermal resistance between heat sinks and a microprocessors and other integrated circuit (IC) devices.

It is well known to use a heat sink to cool a heat generating IC device or package. Typically, a heat sink is arranged in close contact with a heat generating IC package, such as a Central Processing Unit (CPU). Heat is removed from the CPU to prevent the CPU from shutting down to avoid thermal overload. Heat generated by the CPU is transferred to the heat sink and then dissipated from the heat sink to the surrounding air. To further facilitate the dissipation of heat from the IC package a fan can be used to circulate air about outer surfaces of the heat sink.

Heat is transferred from the IC package to the heat sink most effectively by direct surface contact between the interfacing surface of the IC package, such as the case or upper lid of the CPU, and the base of the heat sink. However, the surfaces of the heat sink and IC package cannot be made completely even or smooth. That is, there is always some unevenness in the material surfaces such that an air gap will exist between the two abutted surfaces of the IC package and the heat sink. Since air has a relatively poor thermal conductivity as compared to most metals and other materials typically used in the manufacture of heat sinks and the outer cases of the IC packages, most heat sink manufacturers polish the heat sink interface in an effort to minimize the air gap. If the air gap could be eliminated, the transfer of heat from the IC package to the heat sink could be enhanced.

Historically, in some electronic systems, such as, for instance, a pin grid array (PGA) system, where a PGA package, such as a PGA microprocessor, is loaded onto a PGA socket on a motherboard, a liquid or phase change thermal interface material (TIM) has been used to enhance heat transfer from the PGA package to the heat sink. Typically, the TIM is a silicon grease loaded with aluminum and zinc or a wax based phase change material. When the IC package heats up, the TIM liquefies to fill the air gaps between the heat sink and the IC package and enhance the transfer of heat from the IC package to the heat sink.

In the more recently developed land grid array (LGA) system, the LGA socket has a field of spring contacts in the base of the socket. The base of the LGA package has a complementary field of contact pads that touch the spring contacts when the LGA package is compressively loaded onto the LGA socket. The phase change and loaded silicone TIM's are generally not suited for use in the package-to-heat sink interface in LGA applications. If used with an LGA system, the liquefied TIM could migrate off of the LGA package and into the spring contacts in the LGA socket causing intermittent connections between the spring contacts and the contact pads on the LGA package and interfering with the operation of the LGA package. Such problems tend to not be experienced with PGA systems since the pins on the PGA package fit through a plastic screen on the top of the PGA socket. By contrast, the spring contacts in the LGA socket and the contact pads on the base of the LGA package are both exposed.

BRIEF DESCRIPTION OF THE INVENTION

In one aspect, a heat sink assembly for cooling a heat generating integrated circuit (IC) component is provided. The assembly includes a heat sink base positioned adjacent the IC component and a thermal interface member positioned between the heat sink base and the IC component. The interface member has a first surface in abutting engagement with the heat sink base and an opposite second surface in abutting engagement with an outer surface of a lid on the IC component. The first and second surfaces each include a plurality of protrusions to increase a number of contact points between the interface member and the heat sink base and between the interface member and the outer surface of the lid to facilitate a transfer of heat from the IC component to the heat sink base.

Optionally, the protrusions extend a distance from the first and second surfaces that substantially corresponds to deviations in a texture of the outer surface of the lid on the IC component. The protrusions extend a distance from the first and second surfaces of about two and one half thousandths (0.0025) of an inch to about five thousandths (0.005) of an inch. The interface member includes a dead soft copper foil having a thickness of about five thousandths (0.005) of an inch. The first surface of the interface member may be bonded to the heat sink base and an interface between the second surface of the interface member and the outer surface of the lid is a dry interface.

In another aspect, a heat sink assembly for cooling a heat generating IC component is provided that includes a heat sink base positioned adjacent the IC component and a thermal interface member positioned between the heat sink base and the IC component. The interface member has a first surface abutting the heat sink base and an opposite second surface abutting an outer surface of a lid on the IC component. The second surface of the interface member is provided with a surface finish that substantially corresponds to the surface finish on the outer surface of the lid on the IC component.

In yet another aspect, a thermal interface member for filling a gap in an interface between a heat sink base and a heat generating IC component is provided. The thermal interface member includes a foil sheet having a first surface configured for abutting engagement with the heat sink base and an opposite second surface configured for abutting engagement with the IC component. The first and second surfaces each include a plurality of protrusions to increase a number of contact points between the interface member and the heat sink base and between the interface member and the IC component to facilitate a transfer of heat from the IC component to the heat sink base.

DETAILED DESCRIPTION OF THE INVENTION

Figure 1:
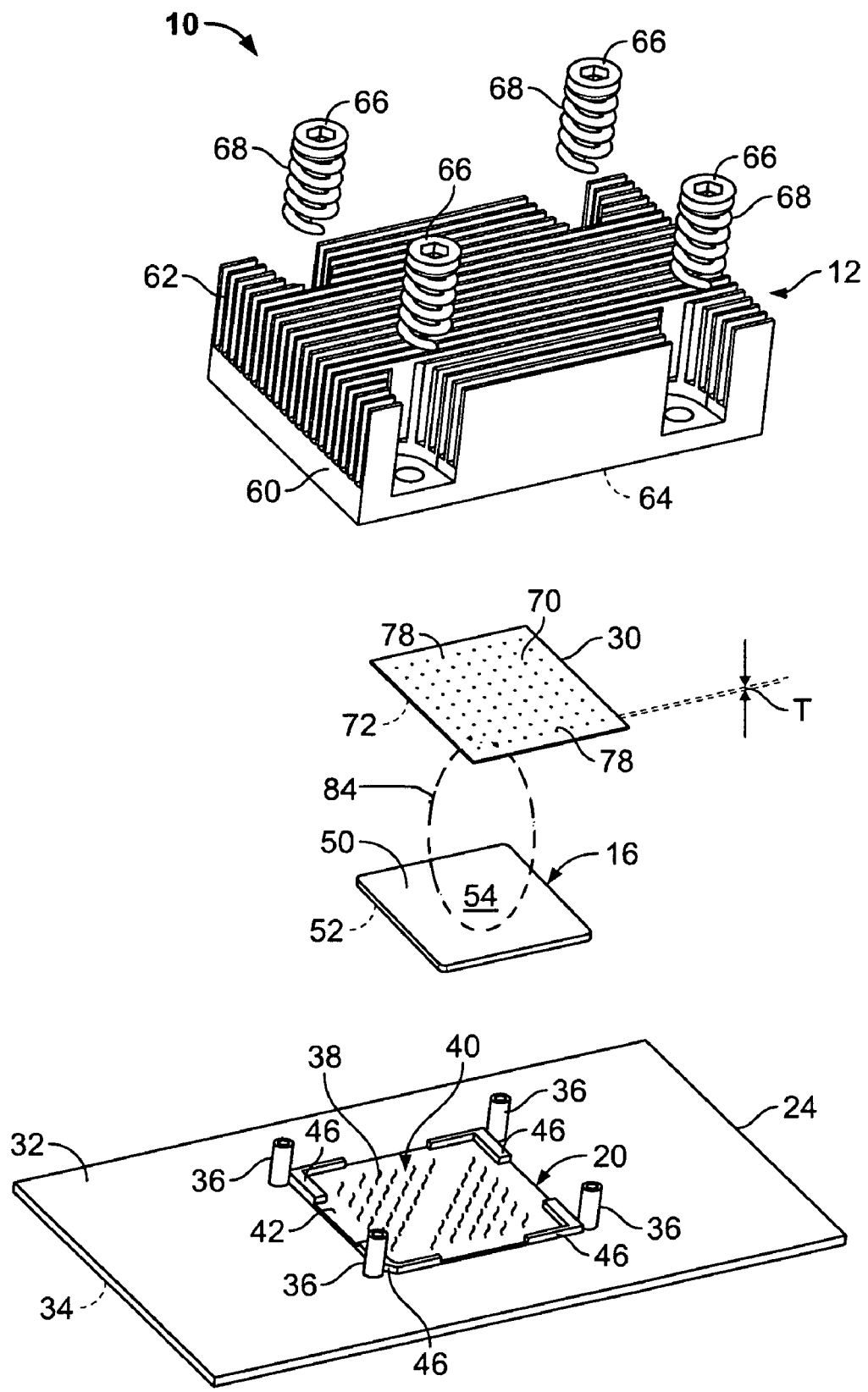
FIG. 1 is an exploded view of an electronic assembly formed in accordance with an exemplary embodiment of the present invention.

FIG. 1 illustrates an electronic assembly 10 formed in accordance with an exemplary embodiment of the present invention. The assembly 10 includes a heat sink 12 provided to cool an IC component 16. The IC component 16 is loaded onto a socket 20 that is mounted on a circuit board 24. A thermal interface member 30 is interposed between the heat sink 12 and the IC component 16.

The IC component 16 can be any power consuming device such as, but not limited to, a central processing unit (CPU), microprocessor, or an application specific integrated circuit (ASIC), or the like. While the invention will be described in terms of a land grid array (LGA) IC component, it is to be understood that the following description is for illustrative purposes only and is but one potential application of the inventive concepts herein.

The circuit board 24 has a first or upper side 32 and a second or lower side 34 opposite the upper side 32. The circuit board 24 includes mounting posts 36 that extend from the upper side 32 of the circuit board 24. The mounting posts 36 are used to hold the completed assembly 10 together.

The socket connector 20 is mounted to the first or upper side 32 of the circuit board 24. The socket connector 20 includes a plurality of electrical spring contacts 38 that are arrayed in a contact field 40 in the base 42 of the connector 20. The contacts 38 each includes a solder ball paddle (not shown) at a mounting end (not shown). A solder ball (not shown) is placed on the solder ball paddle on each of the contacts 38. The solder balls are used for mounting the socket connector 20 to the circuit board 24. The contacts 38 deliver both signal and power to the IC component 16. In one embodiment, the socket connector 20 is a land grid array (LGA) socket. However, in alternative embodiments, other commonly used connector formats such as a pin grid array (PGA) or ball grid array (BGA) can be used. The socket connector 20 also includes raised corner sections 46 that position and align the IC component 16 in the socket connector 20.

The IC component 16 includes an upper side 50 and a lower side 52 opposite the upper side 50. The IC component 16 is a sealed unit wherein the upper side 50 constitutes a cover or lid that protects internal components (not shown) of the IC component 16. The upper side or lid 50 has an outer surface 54. Heat generated in the IC component 16 during operation is transferred out of the IC component 16 through the outer surface 54 of the lid 50. In an exemplary embodiment, the IC component 16 is an LGA package. The lower side 52 of the IC component 16 includes a complementary array of contact pads (not shown) that mate with the array 40 of spring contacts 38 in the socket connector 20. The lower side 52 includes contact pads for both power delivery and signal delivery. The power contact pads (not shown) establish a power connection for the power needed to run the IC component 16 and are positioned toward the center region or core of the IC component 16. Signal contact pads (not shown) are arranged around the center of the IC component 16 and extend to the perimeter of the IC component 16 on the lower side 52 of the IC component 16.

The heat sink 12 includes a heat sink base 60 and a plurality of cooling fins 62 extending upwardly from the base 60. The heat sink base 60 and the fins 62 are typically fabricated from metal such as aluminum or copper, and further, the heat sink base 60 and the fins 62 may be fabricated from the same or different metals. For instance, in one embodiment the heat sink base 60 may be fabricated from copper while the fins 62 may be fabricated from aluminum. The heat sink base 60 has a lower surface 64 that receives heat generated in the IC component 16. In some embodiments, a fan (not shown) may be mounted above the cooling fins 62 for circulating air about the cooling fins 62 and the heat sink base 60 to facilitate the transfer of heat from the IC component 16 and the heat sink 12 to the surrounding air.

The assembly 10 is held together with fasteners 66 and bias springs 68 that are located at the heat sink 12. the fasteners 66 extend to and are received in the mounting posts 36 on the circuit board 24. In one embodiment, the fasteners 66 may be screws or bolts, or similar fasteners. In one embodiment, the socket connector 20 is an LGA connector which requires a compressive load to assure proper mating of the spring contacts 38 in the socket connector 20 and contact pads (not shown) on the IC component 16. The compressive load is supplied by the springs 68. Alternative embodiments of the invention may include components not requiring compressive loading in which case the springs 68 may be eliminated.

The thermal interface member 30 is interposed between the heat sink 12 and the IC component 16 to fill or minimize a microscopic air gap between the heat sink 12 and the IC component 16 to enhance heat flow from the IC component 16 to the heat sink 12, or more specifically to the heat sink base 60. The interface member 30 is a thin sheet or foil that has a first or upper surface 70 that is configured for abutting engagement with the heat sink base 60 and an opposite second or lower surface 72 that is configured for abutting engagement with the outer surface 54 of the lid 50 of the IC component 16. The first and second surfaces 70 and 72, respectively, each include a plurality of protrusions 78 to provide an increased number of contact points between the interface member 30 and the heat sink base 60 and likewise to provide an increased number of contact points between the interface member 30 and the outer surface 54 of the lid 50 of the IC component 16. In this manner, more heat flow paths are provided between the IC component 16 and the heat sink base 60 to facilitate a transfer of heat from the IC component 16 to the heat sink base 60. In an exemplary embodiment, the thermal interface member 30 is a foil of dead soft copper having a thickness T of about five thousandths (0.005) of an inch. Dead soft copper offers an additional advantage in that it is deformable which increases the metal-to-metal contact between the interface member 30, the IC component 16, and the heat sink base 60. In other embodiments however, the thermal interface member 30 may be fabricated from other metals such as aluminum or silver or other thermally conductive material.

Figure 2:
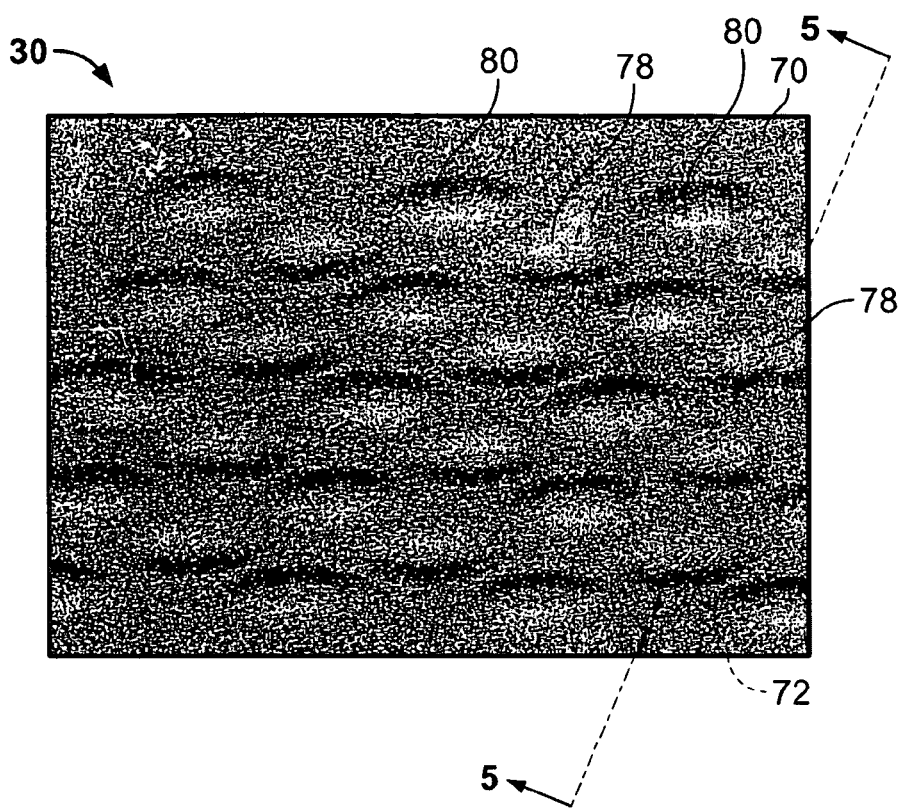
FIG. 2 is a magnified image showing the surface of a thermal interface member formed in accordance with an exemplary embodiment of the present invention.

FIG. 2 is a magnified image of a portion of the surface of the thermal interface member 30. The protrusions 78 on the upper and lower surfaces 70 and 72, respectively, are formed by a rolling process such that, on each of the upper and lower surfaces 70 and 72, respectively, there are both protrusions 78 and dimples 80, wherein each dimple 80 corresponds to the underside of a protrusion 78. In one embodiment, the upper surface 70 of the interface member 30 is bonded to the lower surface 64 (FIG. 1) of the heat sink base 60. In other embodiments, the interface member 30 may not be bonded to the heat sink base 60. In either configuration, an interface 84 (FIG. 1) between the lower surface 72 of the interface member 30 and the outer surface 54 (FIG. 1) of the lid 50 of the IC component 16 may be a dry interface 84 wherein traditional thermal interface materials such as pastes or phase change materials are not employed. More specifically, while the use of a traditional thermal interface material between the interface member 30 and the outer surface 54 of the lid 50 is not prohibited, the interface member 30 may be used as a dry interface without thermal interface materials, and particularly without thermal interface materials that liquefy in use, in applications where liquefying thermal interface materials cannot be tolerated, such as, for instance, in LGA applications.

Figure 3:
FIGS. 3 and 4 are scanning electron microscope images of a typical CPU case lid.
Figure 4:

It is well known that material surfaces cannot be made completely smooth. FIGS. 3 and 4 are scanning electron microscope images of a typical CPU case lid magnified twenty-five hundred times (2500×) and illustrate a typical surface finish on the outer surface of a CPU lid such as the lid 50 of the IC component 16. Current CPU manufacturers use a coining or stamping process to produce CPU lids. The lids are produced to a nominal flatness specification of about five thousandths (0.005) of an inch.

The lower surface 72 of the interface member 30 is provided with a surface finish that substantially corresponds to or is complementary to a surface finish on the outer surface 54 of the lid 50 of the IC component 16 so that more intimate contact is established between the two. Matching the surface finishes of the lower surface 72 of the interface member 30 and the outer surface 54 of the lid 50 provides, an increased number of direct points of contact at a microscopic level between the interface member 30 and the lid 50 of the IC component 16 to thereby lower the resistance to heat flow from the IC component 16 to the interface member 30. In one embodiment, the lower surface of the interface member 30 is chemically etched to provide a surface finish or texture, including roughness, that substantially matches that of the outer surface 54 of the lid 50. In alternative embodiments, the desired surface finish is obtained using other known techniques such as impinge blasting using sand, glass bead, walnut, shot, or other media. Further, in some embodiments, rolling or stamping processes may also be employed to produce the desired surface finish.

The protrusions 78 are formed on the upper and lower surfaces 70 and 72, respectively, of the interface member 30 to further increase the number of contact points between the lid 50 of the IC component 16 and the interface member 30 and between the interface member 30 and the heat sink base 60 to enhance the transfer of heat from the IC component 16 to the heat sink base 60.

Figure 5:
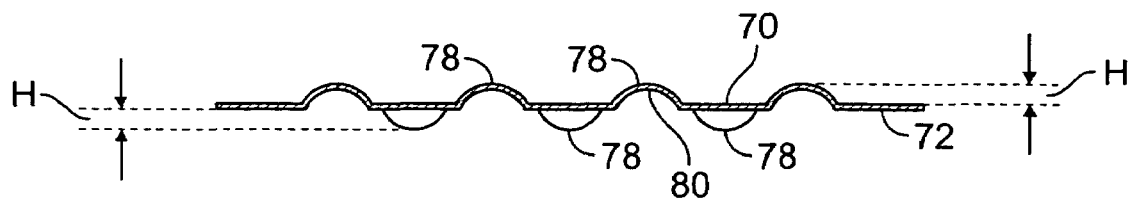
FIG. 5 is a cross sectional view of the interface member taken along the line 5-5 in FIG. 2.

FIG. 5 illustrates a cross section of the interface member 30 take along the line 5-5 in FIG. 2. The protrusions 78 extend a distance H from the upper and lower surfaces 70 and 72, respectively, of the interface member 30 that is established to be complementary to the measured surface texture of the outer surface 54 of the lid 50 of the IC component 16. The distance H of the protrusions 78 is adjusted to substantially correspond to the high-to-low deviations in the surface texture. In an exemplary embodiment, the protrusions 78 extend from about two and one half thousandths (0.0025) of an inch to about five thousandths (0.005) of an inch from the upper and lower surfaces 70 and 72, respectively. In some embodiments, wherein the interface member 30 is fabricated from deformable or elastic materials, the distance H may be adjusted to compensate for the compressibility or spring rate of the material. The surface finish on the interface member 30 is established subsequent to the formation of the protrusions 78 and dimples 80.

The matching of surface finishes between the lower surface 72 of the interface member 30 and the outer surface 54 of the lid 50 cooperates with the protrusions 78 to provide a dry heat transfer interface from the IC component 16 to the heat sink base 60 that has a lower resistance to heat flow than is typically experienced with the use of contemporary paste and phase change thermal interface materials. The dry heat transfer interface between the IC component 16 and the heat sink base 60 is particularly advantageous when used with LGA IC component/socket applications. The provision of a dry heat transfer interface alleviates concerns associated with the migration or leakage of thermal interface materials down into the contact field or contact array 40 in the socket 20 and the operational problems that can result.

The embodiments thus described provide a metallic foil interface member 30 for filling the gap between a heat sink 12 and an IC component 16. The interface member 30 provides a substantially dry heat transfer interface that results in a reduced thermal resistance between the IC component 16 and the heat sink 12 to enhance heat flow from the IC component 16 to the heat sink 12. The interface member 30 has a surface finish matched to the surface finish of the outer surface 54 of the lid 50 of the IC component 16 and is further provided with a plurality of protrusions 78 to increase the number of contact points between the interface member 30 and the IC component 16 and between the interface member 30 and the heat sink 12 to further improve the flow of heat from the IC component 16 to the heat sink 12. The dry heat transfer interface also alleviates concerns associated with migration or leakage of thermal interface materials down into the contact field in the socket in LGA applications.

While the invention has been described in terms of various specific embodiments, those skilled in the art will recognize that the invention can be practiced with modification within the spirit and scope of the claims.

What is claimed is:

1. A heat sink assembly for cooling a heat generating integrated circuit (IC) component, said assembly comprising:
    a heat sink base positioned adjacent the IC component; and
    a thermal interface member positioned between said heat sink base and the IC component, said interface member comprising a metal foil having a first surface in abutting engagement with said heat sink base and an opposite second surface in abutting engagement with an outer surface of a lid on the IC component;
    wherein said first and second surfaces each include a plurality of protrusions to increase a number of contact points between said interface member and said heat sink base and between said interface member and said outer surface of the lid to facilitate a transfer of heat from the IC component to said heat sink base.

2. The heat sink assembly of claim 1, wherein said protrusions extend a distance from said first and second surfaces that substantially corresponds to deviations in a texture of said outer surface of said lid on the IC component.

3. The heat sink assembly of claim 1, wherein said protrusions extend a distance from said first and second surfaces of about two and one half thousandths (0.0025) of an inch to about five thousandths (0.005) of an inch.

4. The heat sink assembly of claim 1, wherein said thermal interface member comprises a dead soft copper foil.

5. The heat sink assembly of claim 1, wherein said thermal interface member comprises a dead soft copper foil having a thickness of about five thousandths (0.005) of an inch.

6. The heat sink assembly of claim 1, wherein said first surface of said interface member is bonded to said heat sink base.

7. The heat sink assembly of claim 1, wherein an interface between said second surface of said metal foil and the outer surface of the lid of the IC component is a dry interface.

8. A heat sink assembly for cooling a heat generating integrated circuit (IC) component, said assembly comprising:
- a heat sink base positioned adjacent the IC component; and
- a thermal interface member positioned between said heat sink base and the IC component, said interface member comprising a thermally conductive sheet having a thickness between opposite first and second surfaces, said first surface abutting said heat sink base and said second surface abutting an outer surface of a lid on the IC component;
- wherein said first and second surfaces of said interface member each include a plurality of protrusions, and wherein said protrusions extend a distance from said first and second surfaces that substantially correspond to deviations in a texture of said outer surface of said lid on the IC component.

9. The heat sink assembly of claim 8, wherein said second surface of said interface member is etched to provide a desired finish.

10. The heat sink assembly of claim 8, wherein said protrusions extend a distance from said first and second surfaces of about two and one half thousandths (0.0025) of an inch to about five thousandths (0.005) of an inch.

11. The heat sink assembly of claim 8, wherein said thermal interface member comprises a dead soft copper foil and said thickness is about five thousandths (0.005) of an inch.

12. The heat sink assembly of claim 8, wherein said first surface of said interface member is bonded to said heat sink base.

13. The heat sink assembly of claim 8, wherein an interface between said second surface of said interface member and the outer surface of the lid of the IC component is a dry interface.

14. A thermal interface member for filling a gap in an interface between a heat sink base and a heat generating integrated circuit (IC) component, said interface member comprising:
- a foil sheet having a first surface configured for abutting engagement with the heat sink base and an opposite second surface configured for abutting engagement with the IC component;
- wherein said first and second surfaces each include a plurality of protrusions to increase a number of contact points between said interface member and the heat sink base and between said interface member and the IC component to enhance a transfer of heat from the IC component to the heat sink base.

15. The thermal interface member of claim 14, wherein said protrusions extend a distance from said first and second surfaces that substantially corresponds to deviations in a texture of said outer surface of the IC component.

16. The thermal interface member of claim 14, wherein said protrusions extend a distance from said first and second surfaces of about two and one half thousandths (0.0025) of an inch to about five thousandths (0.005) of an inch.

17. The thermal interface member of claim 14, wherein said foil sheet comprises a dead soft copper foil having a thickness of about five thousandths (0.005) of an inch.

* * * * *